United States Patent
Perzichilli

(10) Patent No.: US 9,874,859 B1
(45) Date of Patent: Jan. 23, 2018

(54) FRAMEWORK FOR SIMULATIONS OF COMPLEX-ADAPTIVE SYSTEMS

(71) Applicant: Wells Fargo Bank, N.A., San Francisco, CA (US)

(72) Inventor: Marco Paul Perzichilli, Saint Paul, MN (US)

(73) Assignee: Wells Fargo Bank, N.A., San Francisco, CA (US)

( * ) Notice: Subject to any disclaimer, the term of this patent is extended or adjusted under 35 U.S.C. 154(b) by 398 days.

(21) Appl. No.: 14/617,544

(22) Filed: Feb. 9, 2015

(51) Int. Cl.
  *G06G 7/48* (2006.01)
  *G05B 13/04* (2006.01)
  *G06F 17/50* (2006.01)

(52) U.S. Cl.
  CPC ......... *G05B 13/04* (2013.01); *G06F 17/5009* (2013.01)

(58) Field of Classification Search
  CPC ........ G06Q 40/04; G06Q 40/06; G06Q 20/10; G06Q 10/06; G06Q 10/067; G06Q 40/00; G06Q 40/10; G06F 19/3437; G06F 17/5009; G06F 3/0484; G06F 17/18; G06F 17/5002; G06F 11/3696; E21B 43/2406; H02J 31/32; G06T 15/06; G06T 15/50; G06N 99/005
  See application file for complete search history.

(56) References Cited

U.S. PATENT DOCUMENTS

| | | | |
|---|---|---|---|
| 6,697,773 B1 * | 2/2004 | Karchmer | G06F 17/5022 703/15 |
| 9,547,423 B1 * | 1/2017 | Moore | G06F 3/0484 |
| 2002/0169658 A1 * | 11/2002 | Adler | G06Q 10/06 705/7.31 |
| 2004/0054612 A1 * | 3/2004 | Ocampo | G06Q 40/00 705/36 R |
| 2004/0088392 A1 * | 5/2004 | Barrett | G06F 17/5009 709/223 |
| 2006/0155525 A1 * | 7/2006 | Aguilar | G06F 17/5022 703/26 |
| 2006/0184916 A1 * | 8/2006 | Baum | G06N 99/005 717/120 |
| 2006/0242217 A1 * | 10/2006 | Bartels | G06F 17/18 708/270 |
| 2008/0100617 A1 * | 5/2008 | Keller | G06T 15/50 345/421 |
| 2009/0043637 A1 * | 2/2009 | Eder | G06Q 10/067 705/35 |

(Continued)

*Primary Examiner* — Kandasamy Thangavelu
(74) *Attorney, Agent, or Firm* — Merchant & Gould P.C.

(57) ABSTRACT

An initial data state is obtained for an adaptive system. A simulation is started for the adaptive system on an electronic computing device. A first trial is run of the simulation of the adaptive system until a first stop point is reached. When the first stop point is reached, one or more recursive simulations are run from the first stop point. After the one or more recursive simulations have been run, an optimized set of modified data states for the adaptive system at the first stop point is automatically determined. Using the optimized set of modified data states, the run of the first trial of the simulation is continued from the first stop point until either additional stop points are reached or the first trial of the simulation is completed. An additional set of optimized modified data states is determined for at least one of the additional stop points.

20 Claims, 10 Drawing Sheets

(56) References Cited

U.S. PATENT DOCUMENTS

| | | | |
|---|---|---|---|
| 2009/0055150 A1* | 2/2009 | Prior | G06F 19/3437 703/11 |
| 2009/0167763 A1* | 7/2009 | Waechter | G06T 15/06 345/426 |
| 2010/0114618 A1* | 5/2010 | Wilcock | G06Q 10/06 705/7.37 |
| 2010/0198799 A1* | 8/2010 | Krishnan | G06F 11/3696 707/702 |
| 2011/0173146 A1* | 7/2011 | Hnatio | G06Q 10/06 706/14 |
| 2011/0270782 A1* | 11/2011 | Trenner | G06Q 40/10 705/36 T |
| 2012/0004893 A1* | 1/2012 | Vaidyanathan | G06F 19/3437 703/11 |
| 2012/0130703 A1* | 5/2012 | Cutts | G06Q 40/04 703/22 |
| 2012/0185407 A1* | 7/2012 | Scott | G06Q 20/10 705/36 R |
| 2013/0080353 A1* | 3/2013 | Kovarsky | G06Q 40/06 705/36 R |
| 2014/0358307 A1* | 12/2014 | Taniguchi | H02J 3/32 700/291 |
| 2015/0094999 A1* | 4/2015 | VanderHeyden | E21B 43/2406 703/2 |

* cited by examiner

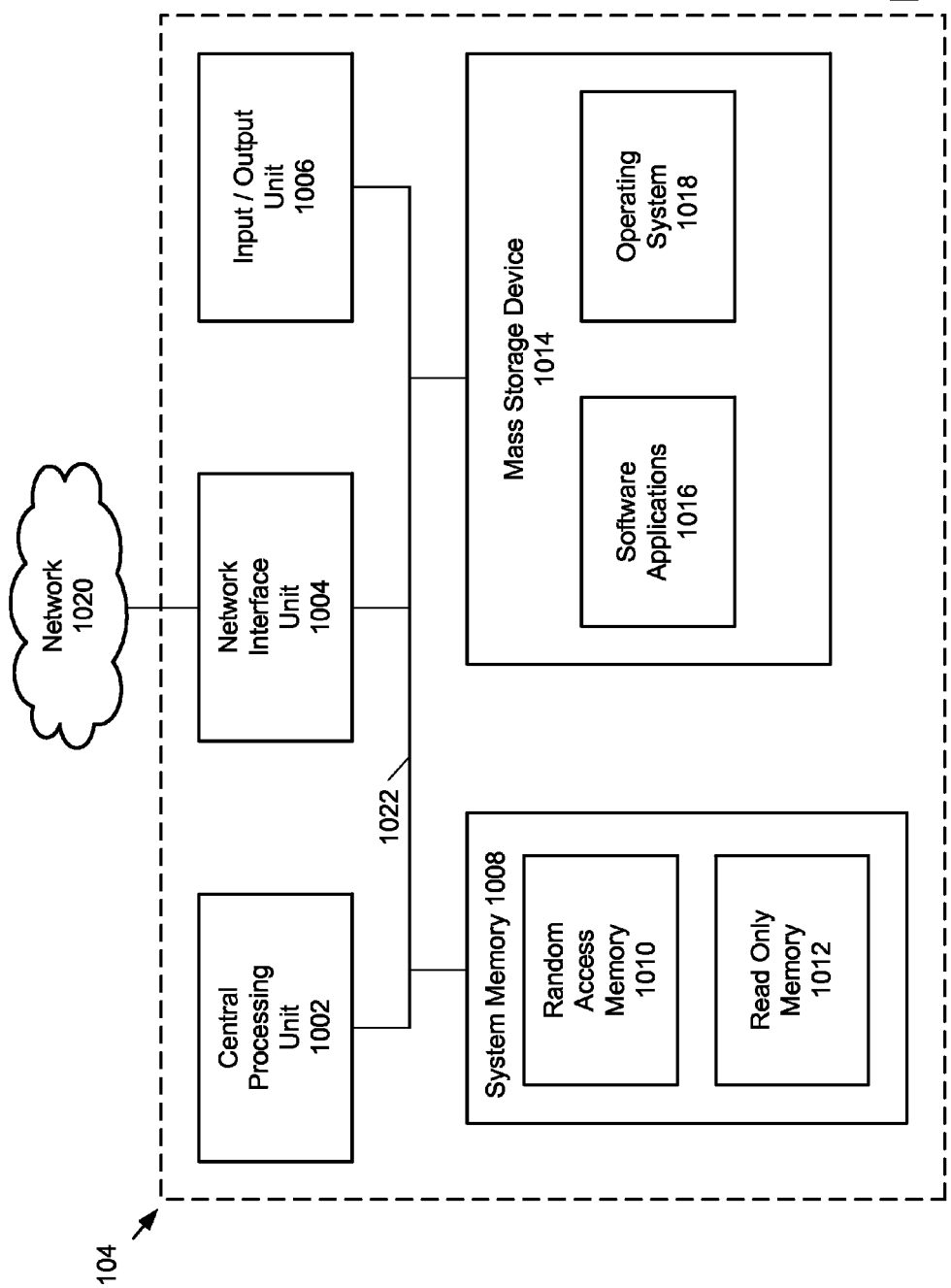

FRAMEWORK FOR SIMULATIONS OF COMPLEX-ADAPTIVE SYSTEMS

BACKGROUND

Complex systems can be dynamic and can include many components that have dependencies and that can change over time. Complex systems can also receive inputs that are external to the systems and random and that result in different system outcomes. In complex-adaptive systems, the behavior of some components can change over time based on learning from previous actions. Some examples of complex-adaptive systems can include biological organisms, chemical reactions and financial systems.

Models can be built to simulate outcomes from complex-adaptive systems. When simulations are run on the complex-adaptive systems, different outcomes can result because of the random data associated with the components and the way that some components evolve over time. Some simulation models can allow for user actions during certain points in a simulation. The inclusion of user actions in a simulation model can sometimes make accurate modeling of complex-adaptive systems difficult to achieve.

SUMMARY

Embodiments of the disclosure are directed to an electronic computing device. The electronic computing device comprises a processing unit and system memory. The system memory includes instructions which, when executed by the processing unit, cause the electronic computing device to: obtain an initial data state for an adaptive system; use the initial data state to start a simulation for the adaptive system; run a first trial of the simulation of the adaptive system until a first stop point of a plurality of stop points is reached; when the first stop point is reached, run one or more recursive simulations from the first stop point; after the one or more recursive simulations have been run, automatically determine an optimized set of modified data states for the adaptive system at the first stop point; using the optimized set of modified data states, continue to run the first trial of the simulation from the first stop point until either additional stop points are reached or the first trial of the simulation is completed; and determine an additional set of optimized modified data states for at least one additional stop point of the plurality of stop points.

In another aspect, an electronic computing device comprises a processing unit and system memory. The system memory includes instructions which, when executed by the processing unit, cause the electronic computing device to: obtain an initial data state for a simulation of a stable value bond fund, the simulation comprising one or more simulation paths; use the initial data state to start the simulation for the stable value bond fund; run a first path of a simulation of the stable value bond fund until a first stop point is reached; when the first stop point is reached, run one or more recursive simulations from the first stop point; after the one or more recursive simulations have been run, automatically determine an optimized set of modified data states for the stable value bond fund at the first stop point; and using the optimized set of modified data states, continue to run the first path of the simulation from the first stop point until either additional stop points are reached or the first path simulation is completed.

In yet another aspect, a computer-readable storage memory comprises instructions that, when executed by a processing unit of an electronic computing device, cause the processing unit to: obtain an initial data state for an adaptive system; use the initial data state to start a simulation for the adaptive system; use the initial data state to start a simulation for the adaptive system; run a trial of the simulation of the adaptive system until a first stop point is reached; when the first stop point is reached, run one or more recursive simulations from the first stop point; after the one or more recursive simulations have been run, automatically determine a first optimized set of modified data states for the adaptive system at the first stop point; using the optimized set of modified data states, continue to run the trial of the simulation from the first stop point until a second stop point is reached; upon reaching the second stop point, calculate a second optimized set of modified data states for the adaptive system at the second stop point; and continue to run the trial until either additional stop points are reached or the first trial of the simulation is completed.

The details of one or more techniques are set forth in the accompanying drawings and the description below. Other features, objects, and advantages of these techniques will be apparent from the description, drawings, and claims.

DESCRIPTION OF THE DRAWINGS

FIG. 10 shows example physical components of the simulation regime server computer of FIG. 1.

DETAILED DESCRIPTION

Figure 1:
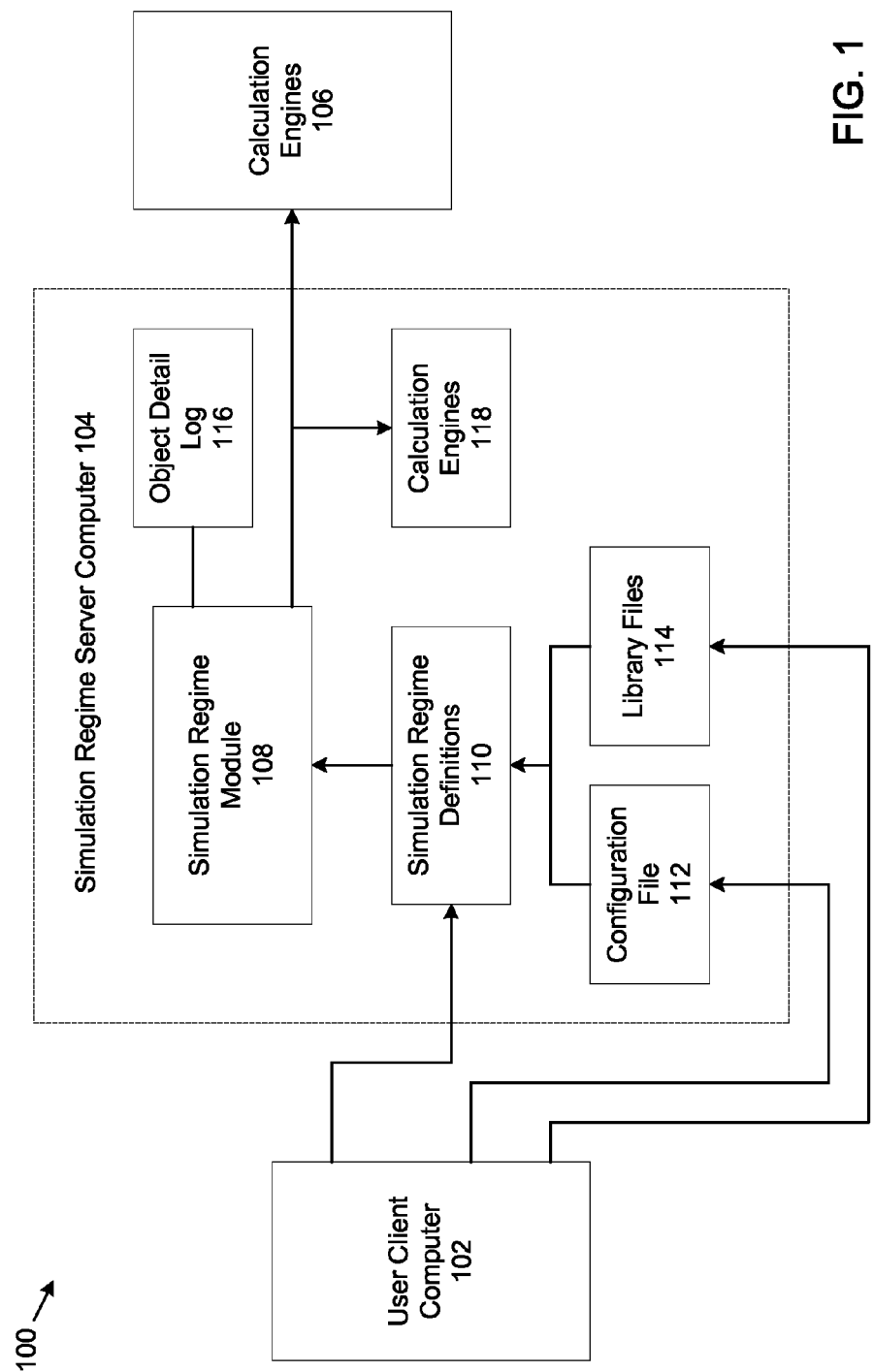
FIG. 1 shows an example system that supports a framework for simulations of complex-adaptive systems.

The present disclosure is directed to systems and methods for performing simulations on complex-adaptive systems. As used in this disclosure, a complex-adaptive system is a dynamic system in which successive states of the system are at least partly dependent on previous states. In addition, complex-adaptive systems can be non-linear systems and can include components whose states may be stochastically (i.e. randomly) determined. Further, complex-adaptive systems can introduce the possibility of learning, whereby some components can spontaneously change behaviors as a result of reasoning or anticipating behaviors of other components.

In general, the systems and methods can be used for simulations of any system that can be represented in discrete time. Some examples include simulating an amount of flex or sway in a building, simulation of the efficacy of a vaccine, simulating a spread of a disease, simulating a chemical reaction and simulating a financial system. Other types of simulations are possible.

As an example of simulating a spread of a disease in a complex-adaptive system, an example complex-adaptive system can comprise a defined population in a geographical area, for example a city. In this example, some people in the city may have contracted influenza. The simulation can model possible outcomes such as how many additional people will contract influenza, how many of these people will be hospitalized, how many people may die from the influenza, how the influenza may spread based on behaviors of infected people, what types of interventions can be done and how specific interventions can affect specific outcomes.

In this example system, each known infected person can be included as a component of the system. Each component can include properties such as age of the person, overall health of the person, contact with infected people, personal behaviors, etc. Each component can also include possible treatment options for the person—such as whether the person visited a doctor, and what type of treatment options were prescribed, such as medicine, bed rest, drink liquids, hospitalization, etc.

A simulation of the example system can start at a certain time and then progress to a stop point, also known as a decision point or a trigger point. For example, health characteristics of the patient can be monitored on a specific date and continue to be monitored each day for a specific number of days, for example a week. At the end of the week, a determination can be made as to the health of the person and as to specific actions that can be taken. For example, when a determination is made at the end of the week that the person does not have influenza, a decision can be made to continue to monitor the health of the person on a daily basis for another week. However, when a determination is made at the end of the week that the person has contracted influenza or has symptoms of influenza, a decision can be made to take one or more additional actions.

Using the systems and methods disclosed herein, actions taken at a stop point in a simulation can be simulated by a programmable agent. The systems and methods permit future choices to be simulated using one or more imaginary, recursive paths in the simulation. For example, one possible choice could be for the person to see a doctor. A second possible choice could be for the person to start one or more home remedies such as bed rest, aspirin, increasing fluid intake and staying warm. A third possible choice could be for the person to do nothing.

Using the systems and methods, each of the possible future choices can be implemented as a recursive simulation along an imaginary path at the stop point. For example, one recursive simulation could be to do nothing for a person who has a high fever and displays other symptoms of influenza. In this imaginary recursive simulation, the person eventually dies. In another recursive simulation, the same patient with a high fever and symptoms of influenza is taken to an emergency room. In this other recursive simulation, the patient recovers. Similar recursive simulations can be done for other actions, such as being treated by a physician at the physician's office and having the patient self-administer home remedies. Moreover, an imaginary, recursive simulation may be repeated multiple times for each possible choice, and the outcomes recorded, so as to characterize the extent of any variability in outcomes owed to randomness.

The outcomes of these imaginary recursive simulations can be analyzed and a globally optimal outcome can be determined. For example, a determination can be made that a most effective choice from a medical outcome and cost standpoint would be for the sick person to go immediately to an urgent care treatment center and be evaluated by a physician. The programmable agent can then implement this choice at the point at which the simulation stopped and continue the simulation in real time from this point. Similar choices can be made by other programmable agents representing other people in the simulation. In addition, as a result of analyzing the imaginary recursive simulations, it is possible that at an outcome can be determined that might not have been previously anticipated.

As another example, using the systems and methods to simulate a medical trial of a vaccine, a determination can be made as to a globally optimal method of administering the vaccine. For example at stop points in the simulation, recursive simulations can be done for waiting specific amounts of time before administering the vaccine and determining a result for each amount of time waited. For example, one recursive simulation could simulate waiting 20 hours before administering the vaccine and another recursive simulation could simulate waiting 30 hours. An evaluation of the recursive simulations can determine the best statistical outcome.

As a preferred embodiment, the systems and methods used in this disclosure are described with respect to a simulation of a stable value fund. As used in this disclosure, a stable value fund is an investment vehicle that combines a portfolio of fixed income assets with one or more contracts that reference the portfolio. The contracts can be insurance contracts or other types of contracts that can mitigate risk for the portfolio of assets. Using the systems and methods, choices made so as to satisfy terms of the contracts can be simulated and an optimal performance result for a simulation of a stable value fund can be obtained.

With a stable value fund, one or more contract clauses may be triggered at certain times based on market or internal conditions. Examples of conditions that may trigger a contract clause include an interest rate reaching a certain level, a value of bonds in the stable value fund falling or rising in value by a certain percentage or a certain dollar amount, an allocation of bonds in the stable value fund reaching a pre-determined threshold, and a certain date or time. Other conditions that may trigger a contract clause are possible.

When a contract clause trigger condition is reached, the contract can contain rules that determine a type of action to take. For example, a rule can determine that if an interest rate reaches a certain level, a specific dollar amount of bonds should be sold. The rules generally provide incentives to maximize a performance of the stable value fund. However, because conditions that cause triggers to occur can be complex it can be difficult for a simulation to determine an appropriate action to take in order to maximize the performance of the stable value fund.

Using the systems and methods, ongoing adherence to the terms of a contract can be simulated through the use of a programmable agent. When a stop point in the simulation is reached, the simulation of the stable value fund can be run in an imaginary branch of the simulation. The stop point, also known herein as a decision point or a trigger point, corresponds to a point in the simulation in which action choices can be made. At the stop point, the imaginary branch implements one or more sub-simulations of an imaginary future agent.

As discussed in more detail later herein, by using the imaginary branch different choices can be tried out and a determination can be made as to which choice is the most effective. When a determination is made as to which choice is the most effective at the stop point, the simulation can continue from the stop point using the choice that was determined to be the most effective while satisfying contractual obligations. This can be repeated for every stop point for every discretionary aspect of the simulation so that a set of choices leading to an optimal risk and performance profile for the stable value fund can be determined.

In the examples described herein, the simulations for complex-adaptive systems are accomplished using computing devices that have been programmed to perform special, complex functions. These specially-programmed devices function to manipulate and provide data to the users in an improved form factor and with greater efficiency.

For example, as described in more detail below, the processes performed by the computing devices allows the user to more effectively and efficiently implement multiple simulation trials and recursive sub-simulations. Such processes can be accomplished using logic and interfaces that are more intuitive and robust for the user.

FIG. 1 shows an example system 100 that supports a framework for stable value bond fund simulations. The example system 100 includes a user client computer 102, a simulation regime server computer 104 and calculation engines 106. The simulation regime server computer 104 includes a simulation regime module 108, simulated regime definitions 110, a configuration file 112, library files 114 and an object detail log 116. The simulation regime server computer 104 can also include calculation engines 118.

The example user client computer 102 can be a desktop computer, laptop computer, tablet computer or similar computing device. A user at user client computer 102 can create a configuration file and create or select library files for the simulation. The user can also define parameters of the simulation including what configuration file to use, how many calculation engines to use and how many paths or trials to be included in the simulation. More detail regarding the parameters of the simulation is provided later herein. More than one user client computer may be used.

As used in this disclosure, a path or a trial comprises a complete run of a simulation from start to finish. In this disclosure, the terms path and trial are used interchangeably. A plurality of trial simulations are typically run because each trial simulation usually results in a different outcome. The outcomes are usually different because objects used in each trial contain values which are usually randomized during each trial. At the completion of the defined number of trials, a globally optimal outcome of the trial simulations can be determined.

The example simulation regime server computer 104 provides functionality for loading a definition for the simulation, recruiting calculation engines, running the simulation and documenting results of the simulation. The simulation regime server computer 104 can also store library files, the configuration file and one or more calculation engines.

The example simulation regime definitions 110 include definitions of which configuration file to use during the simulation, which libraries to load, how many paths or trials to run and how many calculation engines to use.

The example configuration file 112 includes declarations of the objects used in the simulation. The configuration file 112 also includes declarations as to which objects are globally visible and definitions of the objects links to one another. The use of objects and the configuration file are described in more detail later herein.

The example library files 114 include libraries of functions, constants and other data types that can be expected to be used often during the simulation. The library files 114 can be standard library files or user created library files. The simulation regime definitions identify which libraries are loaded during the simulation.

The library files 114 and the configuration file 112 can be cryptographically signed to prevent malicious code execution. For example, the library files 114 and the configuration file 112 can be encrypted using the RSA algorithm so that a public key allows code to be decrypted, loaded and executed, but a private key is required in order to create compatible encrypted files. Thus, the library files 114 and the configuration file 112 become tamper resistant since the library files 114 and the configuration file 112 need to originate from a source that is in possession of the private key.

The example object detail log 116 stores log information that occurs during the simulation. As discussed in more detail later herein, the object detail log 116 simulation stores object information after every time step of the simulation. The object information can include every property of every object used during the time step.

The example calculation engines 106 are components dedicated to executing sections of code during the simulation. Each section of code can implement a specific trial or path in the simulation. Each path can be comprised of real and imaginary branches. A real branch implements execution of one or more time steps in a simulation path. An imaginary branch comprises a possible realization of one or more time steps, starting at a trigger point and projecting the simulation into the future. Two or more paths, each using a separate calculation engine can be run in parallel, i.e. starting at about the same time. However, as discussed later herein, imaginary branches of a path cannot be run in parallel. One or more calculation engines 118 can be located on the simulation regime server computer 104. Other calculation engines 106 can be located external to the simulation regime server computer 104. Communication between the calculation engines 106, 118 and the simulation regime server computer 104 is over dedicated TCP sockets. The TCP sockets are used whether the calculation engines are located on the simulation regime server computer 104 or are external to the simulation regime server computer 104.

In some implementations, a digital dashboard can be provided to display a status of an ongoing simulation. The digital dashboard can display items such as a trial number of a simulation trial in progress, calculation engines currently being used, available calculation engines, a percent completion of a simulation trial, etc. Other status items can be displayed.

After each simulation trial is completed, results of the simulation trial are stored in object detail log file 116 or another log file. When all required simulation trials are completed, the user can analyze the results stored in the log file and determine a global optimization for the simulation. In some implementations, results data can be stored in a spreadsheet. In other implementations, the log file can be automatically analyzed by a computer to determine the global optimization. The global optimization can include an optimal selection of one or more parameters, a configuration, a strategy for the simulation or other items.

The framework for the stable value fund simulations is based on a hierarchy of classes. A simulation class is the highest class in the hierarchy. The simulation class comprises one timeline class. Each timeline class has a plurality of timeline objects, each timeline object corresponding to instantiation of a simulation state class. In turn, each simulation state class is comprised of instances of simulation objects. The hierarchy of classes is explained in more detail herein with respect to FIGS. 2 and 3.

Figure 2:
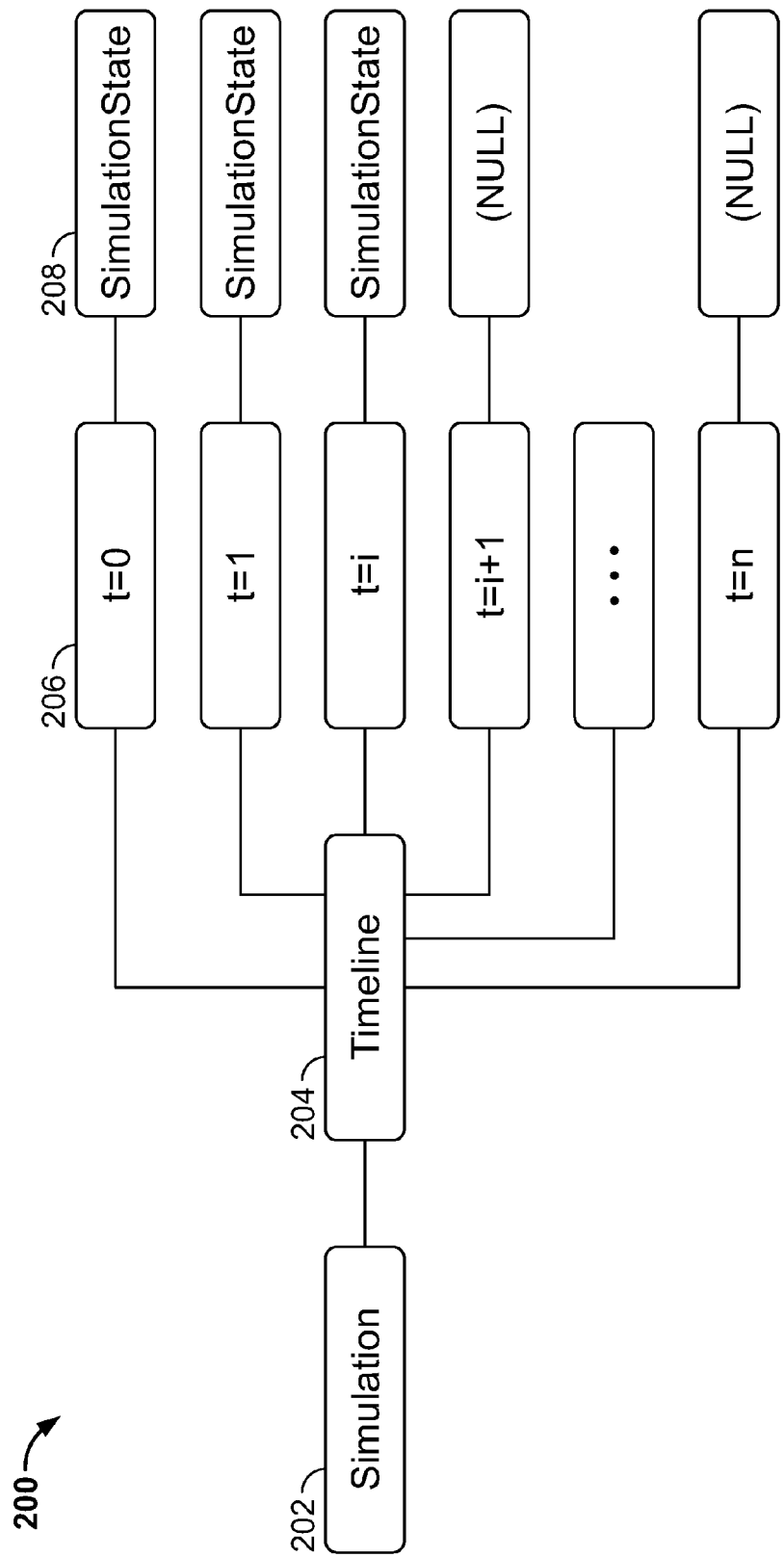
FIG. 2 shows example structure of a timeline object.

FIG. 2 shows an example 200 structure of a timeline class 204. The timeline class 204 has a plurality of timeline objects 206, each timeline object 206 corresponding to a specific time step in the simulation. As shown in FIG. 2, each timeline object corresponds to an instance of a simulation state class 208. Each instance of the simulation state class 208 corresponds to a specific time step (t=0 through t=i). A first instance of the simulation state class 208 occurs at time t=0, a second instance of the simulation state class 208 occurs at time t=1, a third instance of the simulation state class 208 occurs at time t=3, etc. Depending on the nature of objects for the simulation state class and the direction in which the simulation proceeds, the simulation can stop or dead-end after a specific number of time steps. For example, as shown in FIG. 2, the last simulation state for the example structure 200 occurs at time step t=i. At a next time step (t=i+1) and continuing on in time, each simulation state is null.

Figure 3:
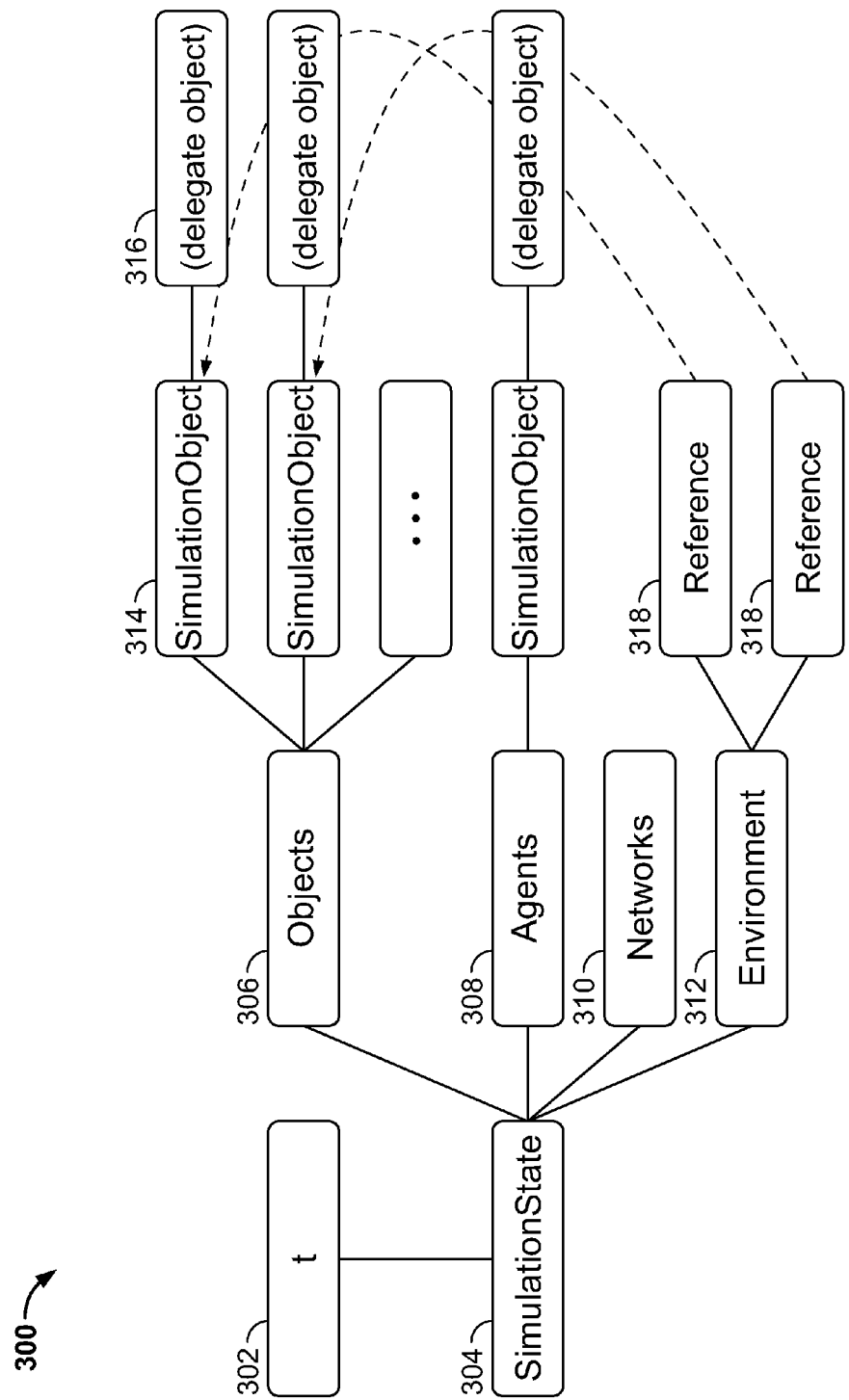
FIG. 3 shows an example structure of a simulation state object of FIG. 2.

FIG. 3 shows an example structure 300 of a simulation state object at a time step 302 of t. As shown in the example structure 300, a simulation state class 304 includes an objects class 306, an agents class 308, a networks class 310 and an environment class 312. Simulation objects 314 are instantiated from the objects class 306 and the agents class 308. Simulation objects 314 that are instantiated from the objects class 306 can simulate specific financial items of interest such as a two-year zero coupon bond, a yield curve or other types of financial items. Simulation objects 314 that are instantiated from the agents class 308 can simulate choices made by agents in the simulation.

As used in the simulation, an agent simulates actions taken by users as a result of contract rules. The actions correspond to choices the users can make based at least in part upon a projected effect each choice could have on the simulation. For example, an evaluation of simulation state conditions at stop points in the simulation can result in one of a plurality of possible choices that can be made by agents. Example choices include buying or selling bonds or winding down a portfolio.

Each simulation object 314 can also instantiate a plurality of delegate objects 316. The delegate objects help to implement functionality within the simulation objects 314. In addition, both the simulation objects 314 and the delegate objects 316 can accept inputs from reference objects 318 that are instantiated from the environment class 312. The delegate objects 316 can provide functionality not captive to the example system 100. For example, a delegate object 316 can contain a software routine that retrieves a value from an Internet application programming interface (API). The reference objects 318 provide a way to specify a linkage to an object, and can therefore be used to provide inputs regarding current activity, for example current bond prices, interest rates, etc.

Figure 4:
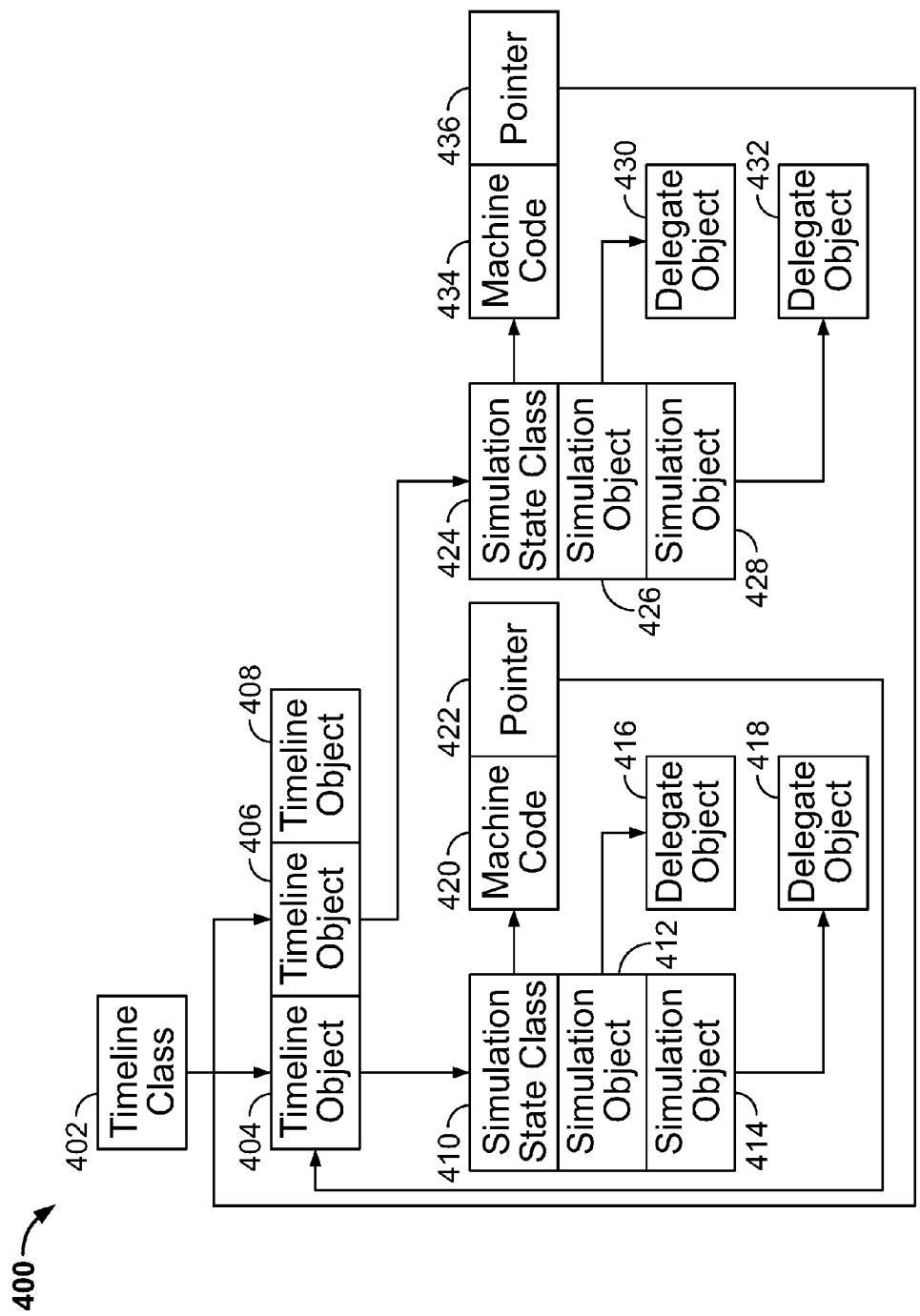
FIGS. 4-6 show example diagrams of how simulation state objects evolve from one time step to another.
Figure 5:
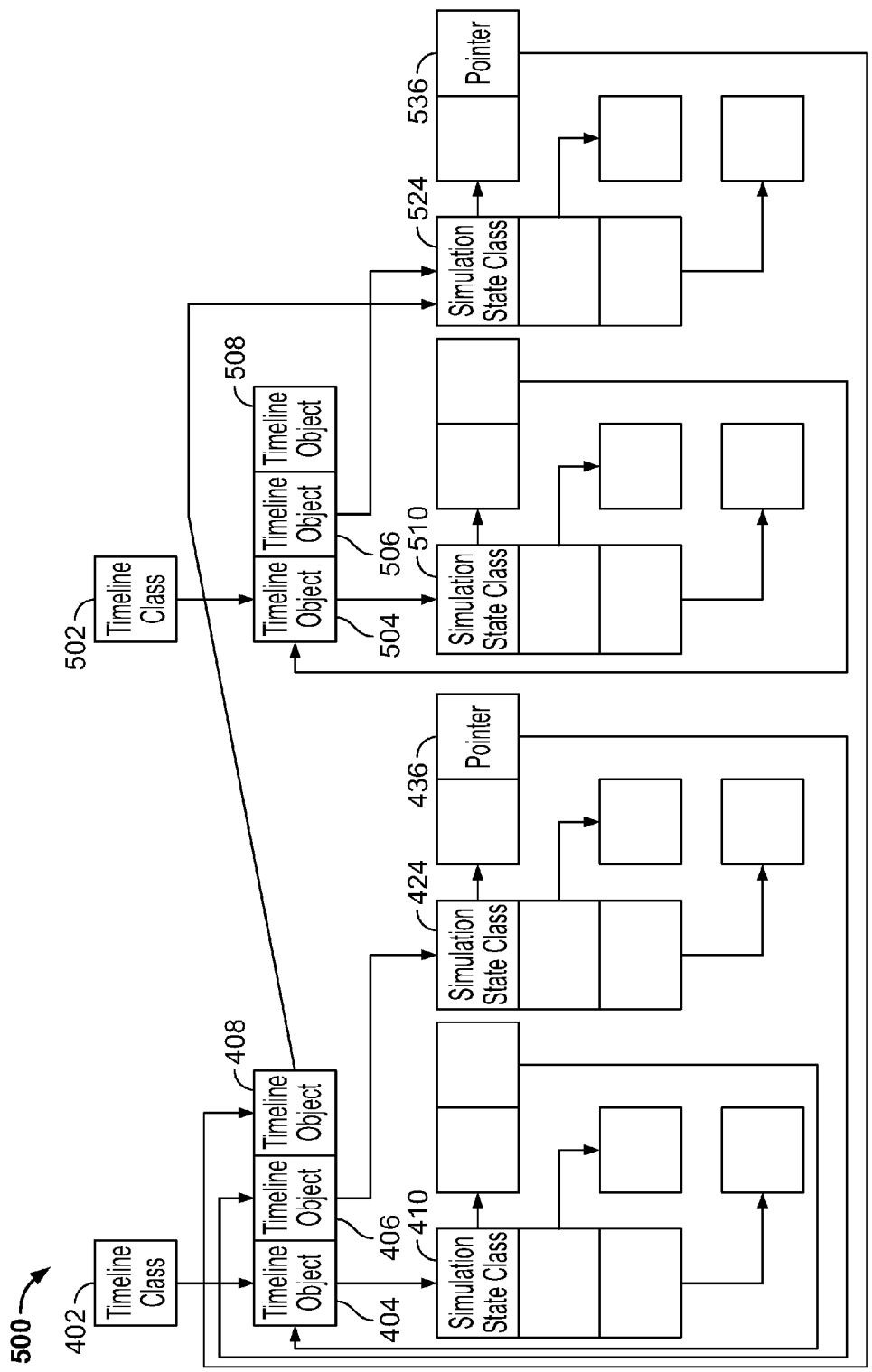
Figure 6:
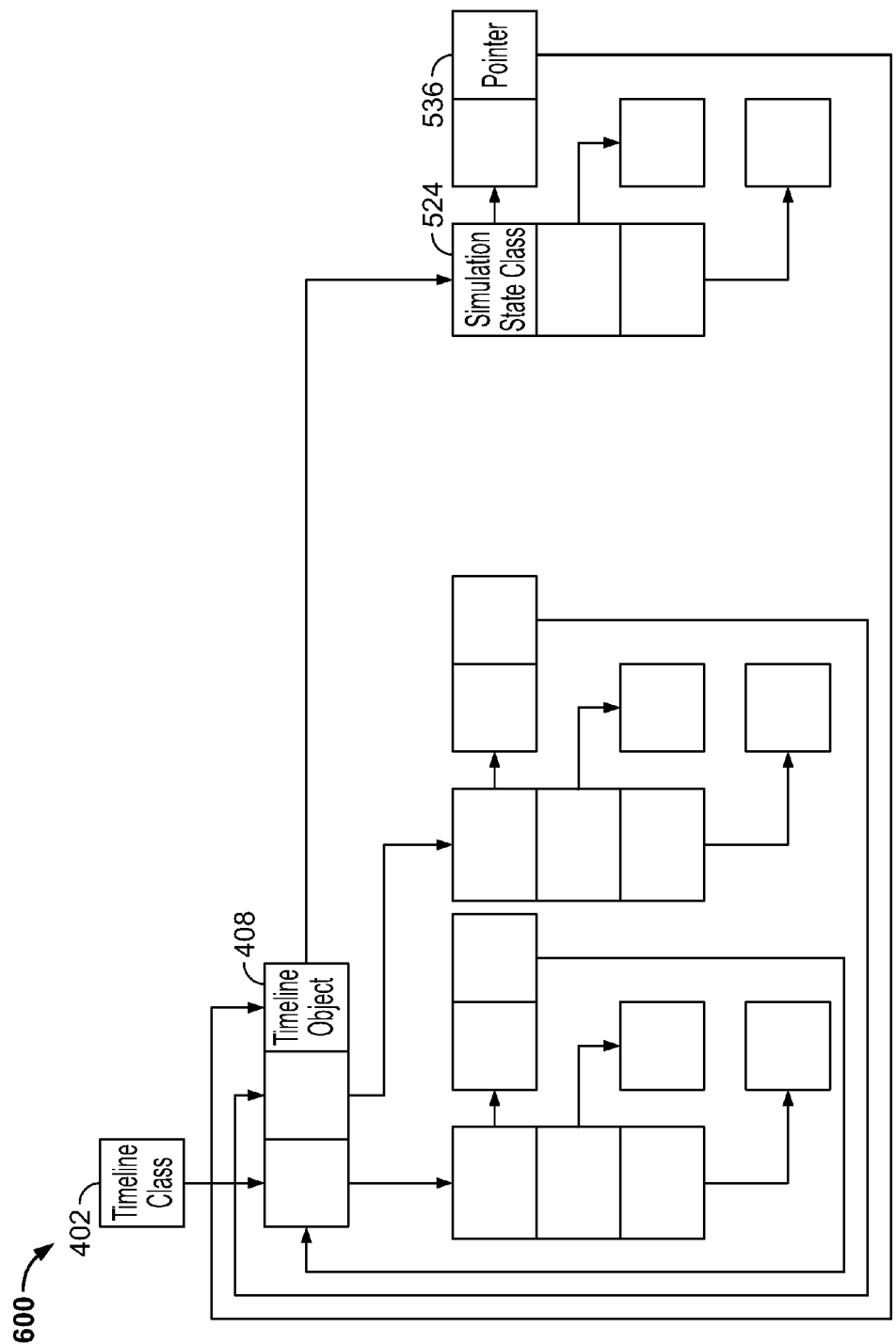

FIGS. 4-6 show an example of how simulation objects can evolve from one time step to another. The framework provides that simulation states can be rolled back to previous states. In order to rollback a simulation state to a previous state, at each simulation state (corresponding to a particular time step), an exact copy is made of the simulation state. Properties and linkages for all objects in a current simulation state are stored in memory. Changes to a simulation state only take place on an exact copy of a predecessor simulation state. The copied simulation state becomes the new current simulation state. Rolling back a simulation to a previous simulation state simply constitutes deleting in memory the simulation states that are no longer wanted, and continuing the simulation from the rolled back simulation state.

FIG. 4 shows an example initial state 400 of a timeline class 402 depicting two timeline objects 404 and 406. At a time step corresponding to timeline object 404, there is an example simulation state class 410 that instantiates two simulation objects 412 and 414. The simulation objects 412, 414 can in turn instantiate delegate objects 416, 418 and other delegate objects not shown. Simulation state class 410 also generates simulation object machine code 420. In addition, the initial state 400 includes a pointer 422 that points back to timeline object 404.

At an example time step corresponding to timeline object 406, there is an example simulation state 424 that instantiates two simulation objects 426 and 428. The simulation objects 426, 428 can in turn instantiate delegate objects 430, 432 and other delegate objects not shown. Simulation state 424 also generates simulation object machine code 434. In addition, the initial state 400 includes a pointer 436 that points back to timeline object 406.

FIG. 5 shows an example state 500 of timeline class 402. The example state 500 occurs after initial state 400 is completed. After initial state 400 is completed, in preparation for advancing to a next time step, a copy is made in memory of all objects in the previous time step. In this case, a copy is made of the objects in the initial state 400.

As shown in example state 500, timeline objects 404, 406 and 408 are copied to become timeline objects 504, 506 and 508, respectively. In addition, simulation state classes 410, 424 and associated objects and pointers are copied to become, respectively, simulation state classes 510, 524 and associated objects and pointers. In addition, a pointer is provided from the next timeline object, timeline object 408, to simulation state class 524. Further, the example state 500 includes a pointer 536 that points back to timeline object 408.

FIG. 6 shows an example state 600 of timeline class 402. The example state 600 occurs when time has advanced to the next time step, indicated by timeline object 408. As shown in example state 600, the portion of example state 500 including timeline 502, timeline objects 504, 506, 508 and simulation state class 510 and associated objects and pointers has been deleted from memory. The simulation can now proceed with the time state associated with timeline object 408.

The framework provides for creating a configuration file, creating a definition of parameters used during the simulation and running one or more simulation trials starting from initial conditions defined by the configuration file and the parameters. Each simulation trial comprises a simulation starting from the initial conditions and running until a stop point. The stop point can occur as a result of the simulation or as a result of being programed to run a specific number of time steps.

At the start of each simulation trial, properties of objects used within the simulation can be programmed to random values so that a result of each simulation trial is different. Each trial can also begin with identical initial conditions, but obtain different results as a consequence of random variability in the simulation components. In addition, each simulation trial includes a plurality of trigger points, each trigger point corresponding to a point in time where discretion may be exercised with respect to management of the assets or contracts included within the stable value fund. At each trigger point, the simulation can include one or more recursive sub-simulations. However, a recursive sub-simulation is not required at a trigger point.

Each recursive sub-simulation corresponds to a possible choice made by an agent seeking to satisfy the obligations and rules included within the relevant contract(s) starting from the trigger point. Each sub-simulation is recursive, because trigger points within a given sub-simulation are handled as if they belonged to the proximate parent branch of that sub-simulation, including trigger points that initiate further sub-simulations. Each sub-simulation represents an imaginary branch of the main simulation and represents a possible future choice or series of future choices taken by the main simulation. After a predetermined number of recursive sub-simulations are run, the framework determines a best outcome from the sub-simulations. The main simulation can then be run from the trigger point using choices or properties of objects from the sub-simulation that provided the best outcome.

Some example objects specific to simulating a stable value fund include a yield curve, participant contributions and withdrawals, risk premiums, the inflation rate, individual fixed income instruments (i.e. bonds) and market indices. Examples of stable value fund properties a simulation might track include crediting rate, market value and book value.

A yield curve is a logical representation of market yields for various maturities at a given point in time. Future yields can be estimated probabilistically through the use of various theories. An object representing a yield curve can be included in the simulation. The object can contain methods that make use of random numbers than can be input into formulas to calculate movements of short term and long term interest rates for a given time step. Thus, because different random numbers are used for each trial, each simulation path can produce different outcomes. Other techniques for representing a yield curve or the term structure of interest rates are possible.

Participants can contribute and withdraw money from the stable value fund based on different factors. Some factors can include participant demographics, performance of other investment opportunities, overall fear in the marketplace, etc. Relating to participant contributions and withdrawals, simulation objects can be created to represent such factors as return on the stock market and competiveness of a funds crediting rate. Formulas can be included in the simulation objects to calculate outcomes relating to these and other factors. For example, formulas can be included in the simulation objects to simulate a return on the stock market and to simulate the competiveness of a funds crediting rate. The use of the random values in these formulas can result in different outcomes for each trial.

As an example of choices made by an agent, a simulation may stop at a trigger point corresponding to the portfolio of bonds in the stable value fund exceeding a predetermined asset allocation. For example, the stable value fund can be obligated to maintain a certain percentage of short-term bonds, intermediate-term bonds and long-term bonds. Due to simulated market conditions, the percentage can exceed the predetermined asset allocation for one or more categories of bonds. An agent may be embedded that, at the trigger point, will determine an action based on whether the stable value fund is presently exceeding the predetermined asset allocation or, through the use of a sub-simulation, would imminently do so absent an intervention. For example, one action may be to sell bonds in a category in which the asset allocation is exceeded. Another action may be to buy bonds in a category to which the asset allocation is below the predetermined asset allocation. Other actions may involve buying or selling specific bonds or specific categories of bonds. Additional actions may be possible.

The programmable agent can evaluate possible actions using a plurality of imaginary recursive sub-simulations, each imaginary recursive sub-simulation corresponding to a specific action. Each imaginary recursive sub-simulation can project the effect of the action out into the future and measure a value of an outcome. For example, buying a subset of bonds may cause the stable value fund to have a certain value at a projected time in the future and selling a subset of bonds or buying a different subset of bonds can cause the stable value fund to have different values. Each sub-simulation can run until a predetermined number of time steps have occurred in the sub-simulation or until the sub-simulation stops if less time steps than the predetermined number of time steps have occurred.

After all the recursive sub-simulations are run, the agent can determine which configuration, strategy, choice, or series of choices results in the stable value fund having a best outcome at the projected time in the future. The agent can then select the action that resulted in the best outcome and run the main simulation from the trigger point using the selected action. In this way, the agent can find a globally optimal outcome at the trigger point without needing to know anything about rules or behaviors for other objects in the simulation.

The objects included in the framework are arranged in a tree structure. Each object points back to a parent object. As a result of the main simulation and any sub-simulations, function calls can be made to objects going up or down the tree.

During each time step in a simulation or sub-simulation, each object evolves through self-mapping. That is, each object includes instructions to perform some internal actions at each time step. For example, an object can include an instruction to add two variables or to increment a variable or to take some other action. The result of the instructions is to change properties associated with the object over time based on the self-mapping actions. Reference objects can instantiated and passed as parameters to an object when that object is created in the configuration process. It is therefore possible that the self-mapping process for an object manipulates a reference object supplied to it as a parameter, which in turn affects the state of another object within the system.

The framework also makes use of general purpose object templates. The templates define certain types of reusable objects. Some example object templates used in the framework include constant, vector and random normal variate. The constant template provides a variable value at a given time step that never varies. The vector template provides a variable value at a given time step that corresponds to a step in a vector sequence. The random normal template provides a variable value at a given time step that is obtained from a random normal distribution with a specified mean and standard deviation.

The Newtonian object includes both properties and rules, also known as laws of motion. Newtonian objects have their properties and rules defined at run-time rather than codified into their classes. The laws of motion govern how the Newtonian object evolves from one time step to the next.

As an example of describing some of the concepts herein in simpler terms, the systems and methods are described for simulating outcomes when playing a card game. In an example card game, a player only knows three rules: 1) that the player is dealt some cards; 2) that the player must play one of the cards when it is the player's turn and 3) when the player is out of cards, the game is over. Any other rules of the game are hidden from the player.

Because the player doesn't know all the rules of the game, the player decides to focus on an optimal strategy. The player starts by picking four strategies: 1) play the highest card, 2) play the lowest card, 3) play a median card (i.e. a numerical card having a face value approximately halfway between a value of the highest card and the lowest card; and 4) play a random card. The game is to be played 100 times using each strategy and an outcome of each completed game is to be recorded.

At the completion of 400 trials (100 trials for each of the four strategies), a user can analyze log files from the 400 trials and determine a globally optimal parameter, configuration or strategy for the game. However, as described next herein, agents can also use the simulation to make globally optimal choices at a given time step inside the simulation.

At each turn, before actually playing a card, an agent can "imagine" the best card to play before actually playing the card in real time. The agent can simulate choices or actions made by the player. In addition, because the player can have two or more cards in his/her hand when the player's turn arrives, which card is played makes a difference in determining a global optimum because once a card is played, that card is not available for future plays of the game. Thus, the agent can be programmed to choose based on not only which card wins the current hand, but on the effect playing that card has on winning future hands.

As an example, at a given time step an agent has three cards in his/her hand. The agent pauses and runs three recursive simulations (one for each possible choice) to consider which card to play. Each recursive simulation starts at the same trigger point (where the agent has three cards and needs to make a decision as to which card to play). In addition, each recursive simulation is an imaginary simulation because the agent is not actually playing a card, but is instead considering which card to play.

After each choice that the agent makes in a recursive simulation, the recursive simulation advances to a next time step. At the next time step, there is one less card available to play. The agent starts another recursive simulation (a recursive simulation within a recursive simulation), with one less card to play and continues in this manner until the agent plays its final card. Each recursive simulation is this example occurs along an imaginary branch of the simulation. When the agent plays its final card along one imaginary branch of the simulation, the imaginary path is halted and the agent records a number of wins corresponding to playing the specific cards chosen.

The agent can then compare the impact of each set of chosen cards on overall chances of winning Some example outcomes may be as follows:
  Play card 1 now: win 2 of 3.
  Play card 2 now: win 1 of 3.
  Play card 3 now: win 1 of 3.

However, because there may be a random element to this game, the agent repeats the imaginary recursive simulation for each card again. This time the outcomes may be different, as follows:
  Play card 1 now: win 1 of 3.
  Play card 2 now: win 2 of 3.
  Play card 3 now: win 1 of 3.

Repeating the imaginary recursive simulations again, the outcomes may be as follows:
  Play card 1 now: win 2 of 3.
  Play card 2 now: win 1 of 3.
  Play card 3 now: win 1 of 3.

When the agent analyzes the results after completing the imaginary recursive simulations, the agent can determine that the best overall outcome comes from playing card 1 now. This is because playing card 1 now always resulted in 2 wins and 1 loss, whereas playing card 2 or card 3 now sometimes resulted in only 1 win and two losses. Therefore, the agent can decide that playing card 1 now is the globally optimal choice at the trigger point at which the recursive simulations occurred. In addition, the agent was able to make this choice without having full knowledge of the rules of the game.

Continuing with the above example, after the agent determines from the imaginary recursive branches to choose card 1, the agent actually chooses card 1 at the time step of the trigger point, and the timeline advances to a next non-imaginary time step.

As can be seen from the above example, the choice made by the agent was made independently of any optimization exercises being conducted by other agents with the simulation or external to the simulation. A global optimization can be determined by a user analyzing a log file containing results of all the simulation trials or by having a computer system analyze the log file.

Figure 7:
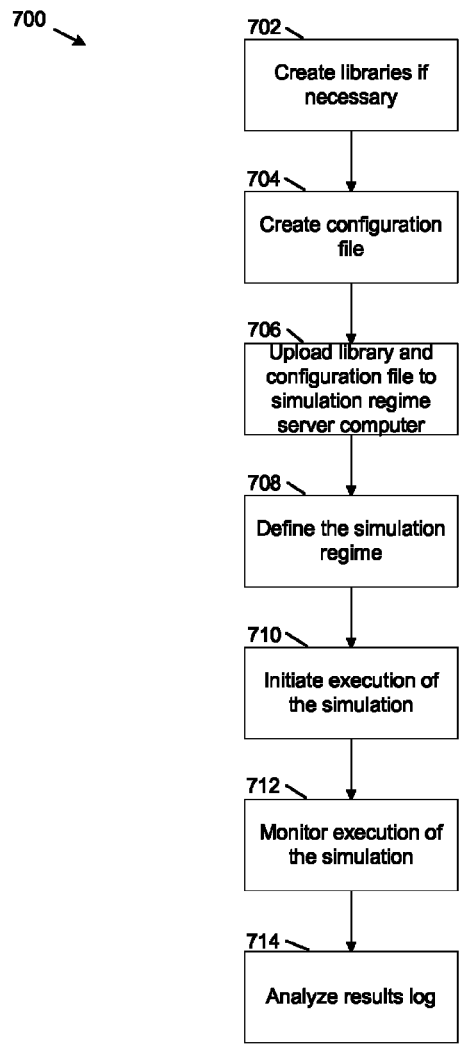
FIG. 7 shows a flowchart for an example method for implementing user actions on the user client computer of FIG. 1 during a simulation.

FIG. 7 shows a flowchart of an example method 700 for implementing user actions during a simulation. The user actions can be implemented, for example, on user client computer 102 of FIG. 1.

At operation 702, a determination is made as to whether non-standard functionality is needed for the simulation. If non-standard functionality is needed, library files corresponding to the needed functionality are created. If non-standard functionality is not needed, existing library files can be used.

At operation 704, a configuration file is created. The configuration file is a script that sets up initial conditions for the simulation. The configuration file includes declarations of objects that will be part of the simulation and can include environments and programmable agents used in the simulation. The configuration file can also indicate which objects will be globally visible as part of the environment and definitions of the objects' links with one another. At operation 706, the library files and configuration file are uploaded to simulation regime server computer 104.

At operation 708, a simulation regime is defined. The simulation regime defines which configuration file to use, which libraries to load and how many calculation engines to use for parallelization. Other definitions are possible.

At operation 710, execution of the simulation is initiated. Execution of the simulation is discussed in more detail later herein. At operation 712, the simulation is monitored by the user.

At operation 714, a log file with results of the simulation is analyzed by the user. In some implementations, the log file is manually analyzed. In some implementations, the log file can be input into one or more databases where the log file information can be organized and processed. In other implementations, the log file may be automatically analyzed by application software on user client computer 102, simulation regime server computer 104 or another electronic computing device.

Figure 8:
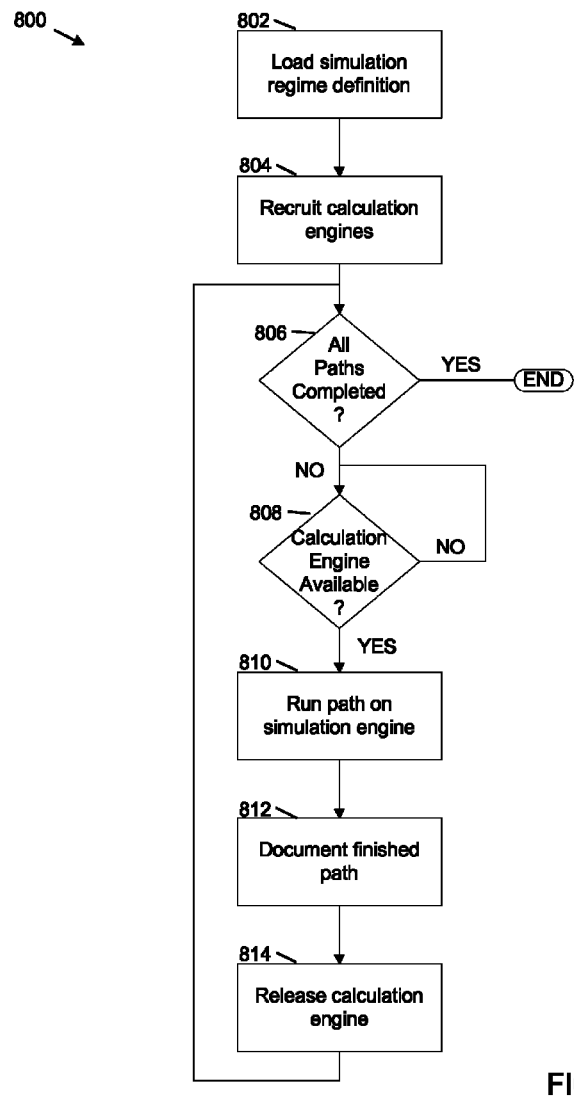
FIG. 8 shows a flowchart for an example method for implementing a simulation on the simulation regime server computer of FIG. 1.

FIG. 8 shows a flowchart of an example method 800 for implementing the simulation on simulation regime server computer 104. At operation 802, the simulation regime definition from operation 708 is loaded on simulation regime server computer 104.

At operation 804, calculation engines are recruited. Available calculation engines can be recruited from simulation regime server computer 104 or from other server computers. The number of calculation engines being recruited is obtained from the simulation regime definition.

As discussed earlier herein, a simulation can consist of a plurality of simulation trials. Each trial is independent of another and can be run in parallel using a separate calculation engine. The number of calculation engines being recruited corresponds to the number of calculation engines used for parallelization. Running simulation trials in parallel increases the speed of the overall simulation because multiple trials can be run at the same time.

At operation 806, a determination is made as to whether all calculation paths have been completed. The number of calculation paths for the overall simulation is obtained from simulation regime definitions 110.

When a determination is made at operation 806 that all paths have not been completed, at operation 808 a determination is made as to whether a calculation engine is available. A calculation engine comprises dedicated memory and processing power for executing a simulation trial. The number of calculation engines available for the overall simulation is also obtained from simulation regime definitions 110. Because each trial is independent of another, simulation trials can be run in parallel, each trial using a different calculation engine.

When a determination is made at operation 808 that a calculation engine is available, a simulation trial is run on the calculation engine. When a determination is made at operation 808 that a calculation engine is not available, the system waits until a calculation engine is available.

At operation 812, a log file is updated for each time step during the simulation path. The log file stores values, properties, links and pointers for all objects in the simulation path during the time step.

At operation 814, the calculation engine is released and made available for use for another simulation trial.

Figure 9:
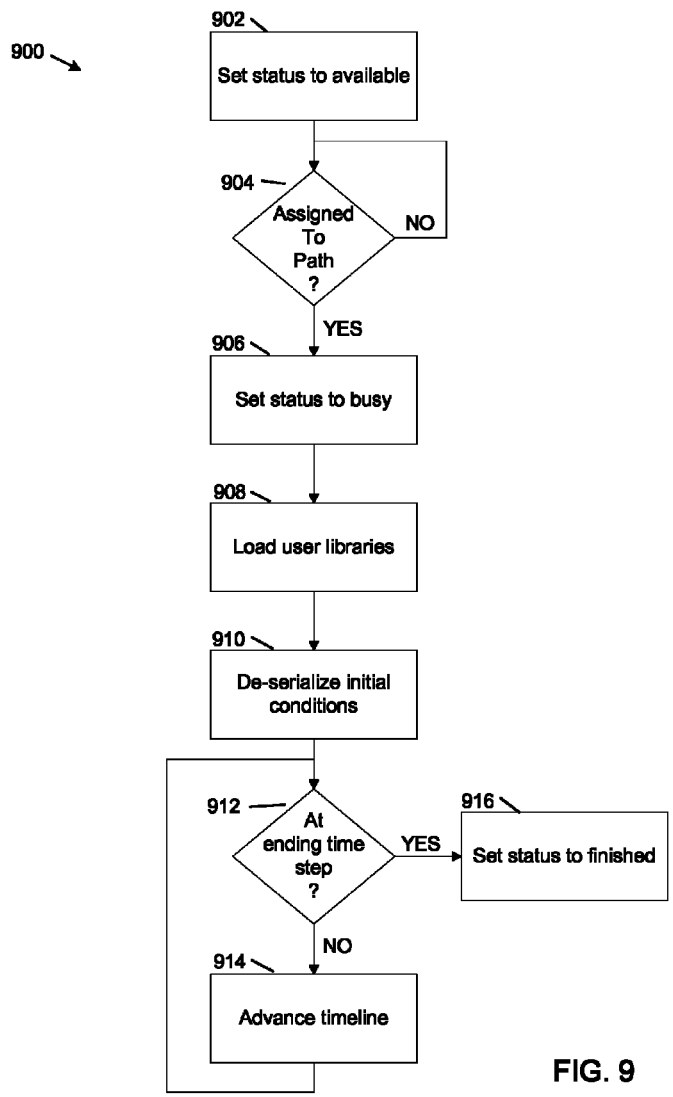
FIG. 9 shows a flowchart for an example method for executing a simulation trial using a calculation engine of FIG. 1.

FIG. 9 shows a flowchart of an example method 900 for executing a simulation trial using a calculation engine.

At operation 902, a status of a calculation engine is set to available. At this point in time, the calculation engine has not been selected yet. At operation 904, the calculation engine repeatedly checks to determine if the calculation engine has been assigned to a simulation path.

At operation 904, when a determination is made that the calculation engine has been assigned to a simulation path, at operation 906, a status of the calculation engine is set to busy.

At operation 908, user libraries are loaded into the selected calculation engine. At operation 910, initial conditions are de-serialized for the selected calculation engine. De-serializing the initial conditions comprises copying the initial conditions to the selected calculation engine. The initial conditions include all definitions from configuration file 112 and simulation regime definitions 110, including all definitions for all objects used in the simulation path.

At operation 912, a determination is made as to whether the simulation is at an ending time step. The number of time steps in a simulation path is assigned as a parameter in the simulation regime definitions 110.

When a determination is made at operation 912 that the ending time step has not been reached, at operation 914 the timeline advances and control returns again to operation 912. When a determination is made at operation 916 that the ending time step has been reached, at operation 916 a status is set to finished for the calculation engine.

As illustrated in the example of FIG. 10, simulation regime server computer 104 includes at least one central processing unit ("CPU") 1002, a system memory 1008, and a system bus 1022 that couples the system memory 1008 to the CPU 1002. The system memory 1008 includes a random access memory ("RAM") 1010 and a read-only memory ("ROM") 1012. A basic input/output system that contains the basic routines that help to transfer information between elements within the simulation regime server computer 104, such as during startup, is stored in the ROM 1012. The simulation regime server computer 104 further includes a mass storage device 1014. The mass storage device 1014 is able to store software instructions and data.

The mass storage device 1014 is connected to the CPU 1002 through a mass storage controller (not shown) connected to the system bus 1022. The mass storage device 1014 and its associated computer-readable data storage media provide non-volatile, non-transitory storage for the simulation regime server computer 104. Although the description of computer-readable data storage media contained herein refers to a mass storage device, such as a hard disk or solid state disk, it should be appreciated by those skilled in the art that computer-readable data storage media can be any available non-transitory, physical device or article of manufacture from which the central display station can read data and/or instructions.

Computer-readable data storage media include volatile and non-volatile, removable and non-removable media implemented in any method or technology for storage of information such as computer-readable software instructions, data structures, program modules or other data. Example types of computer-readable data storage media include, but are not limited to, RAM, ROM, EPROM, EEPROM, flash memory or other solid state memory technology, CD-ROMs, digital versatile discs ("DVDs"), other optical storage media, magnetic cassettes, magnetic tape, magnetic disk storage or other magnetic storage devices, or any other medium which can be used to store the desired information and which can be accessed by the simulation regime server computer 104.

According to various embodiments of the invention, the simulation regime server computer 104 may operate in a networked environment using logical connections to remote network devices through the network 1020, such as a wireless network, the Internet, or another type of network. The simulation regime server computer 104 may connect to the network 1020 through a network interface unit 1004 connected to the system bus 1022. It should be appreciated that the network interface unit 1004 may also be utilized to connect to other types of networks and remote computing systems. The simulation regime server computer 104 also includes an input/output controller 1006 for receiving and processing input from a number of other devices, including a touch user interface display screen, or another type of input device. Similarly, the input/output controller 1006 may provide output to a touch user interface display screen or other type of output device.

As mentioned briefly above, the mass storage device 1014 and the RAM 1010 of the simulation regime server computer 104 can store software instructions and data. The software instructions include an operating system 1018 suitable for controlling the operation of the simulation regime server computer 104. The mass storage device 1014 and/or the RAM 1010 also store software instructions, that when executed by the CPU 1002, cause the simulation regime server computer 104 to provide the functionality of the simulation regime server computer 104 discussed in this document. For example, the mass storage device 1014 and/or the RAM 1010 can store software instructions that, when executed by the CPU 1002, cause the simulation regime server computer 104 to display received data on the display screen of the simulation regime server computer 104.

Although various embodiments are described herein, those of ordinary skill in the art will understand that many modifications may be made thereto within the scope of the present disclosure. Accordingly, it is not intended that the scope of the disclosure in any way be limited by the examples provided.

What is claimed is:

1. An electronic computing device comprising:
a processing unit; and
system memory, the system memory including instructions which, when executed by the processing unit, cause the electronic computing device to:
obtain an initial data state for an adaptive system;
use the initial data state to start a simulation for the adaptive system;
run a first trial of the simulation of the adaptive system until a first stop point of a plurality of stop points is reached;
when the first stop point is reached, run one or more recursive simulations from the first stop point;
after the one or more recursive simulations have been run, automatically determine an optimized set of modified data states for the adaptive system at the first stop point;
using the optimized set of modified data states, continue to run the first trial of the simulation from the first stop point until either additional stop points are reached or the first trial of the simulation is completed; and
determine an additional set of optimized modified data states for at least one additional stop point of the plurality of stop points.

2. The electronic computing device of claim 1, wherein after the first trial of the simulation is completed, further comprising:
run one or more additional simulation trials; and
after the one or more additional simulation trials have been run, determine an optimization for the adaptive system based on the simulation trials that were run.

3. The electronic computing device of claim 1, wherein obtain an initial data state for the adaptive system comprises:
obtain a configuration file for use in the simulation;
determine one or more library files for use in the simulation;
determine one or more initial parameters for the simulation; and
parse the configuration file.

4. The electronic computing device of claim 3, wherein determine one or more initial parameters for the simulation includes determining a number of simulation trials to run.

5. The electronic computing device of claim 1, wherein the first trial of the simulation includes one or more time steps, each time step including one or more simulation objects.

6. The electronic computing device of claim 5, further comprising: after each of the one or more time steps, store a copy of a state of the simulation.

7. The electronic computing device of claim 6, wherein a copy of the state of the simulation comprises properties and links of all objects at the time step in which the copy of the state of the simulation is made.

8. The electronic computing device of claim 6, wherein each recursive simulation occurs on an exact copy of the state of the simulation at the stop point from which the recursive simulation occurs.

9. The electronic computing device of claim 1, wherein the one or more recursive simulations are run without requiring operational knowledge of the complex adaptive system.

10. The electronic computing device of claim 1, wherein each recursive simulation is based on a choice of parameters at each stop point.

11. The electronic computing device of claim 1, wherein each recursive simulation is run either until the recursive simulation reaches a next stop point or a predetermined time/step limit is reached.

12. The electronic computing device of claim 1, wherein run one or more recursive simulations comprises:
start a first recursive simulation from the first stop point;
run the first recursive simulation until a second stop point or a predetermined time/step limit is reached;
store one or more results from the first recursive simulation;
restore a state corresponding to the first stop point;
start another recursive simulation from the first stop point;
run the another recursive simulation until a third stop point or the predetermined time/state limit is reached;
store one or more results from the another recursive simulation;
restore a state corresponding to the first stop point; and
continue to start and run additional recursive simulations, stopping at stop points or when the predetermined time/step limit is reached until a predetermined limit for a number of recursive simulations is reached.

13. The electronic computing device of claim 1, wherein the adaptive system is comprised of one or more objects having properties that change value based on rules contained within the objects.

14. An electronic computing device comprising:
a processing unit; and
system memory, the system memory including instructions which, when executed by the processing unit, cause the electronic computing device to:
obtain an initial data state for a simulation of a stable value bond fund, the simulation comprising one or more simulation paths;
use the initial data state to start the simulation for the stable value bond fund;
run a first path of a simulation of the stable value bond fund until a first stop point is reached;
when the first stop point is reached, run one or more recursive simulations from the first stop point;
after the one or more recursive simulations have been run, automatically determine an optimized set of modified data states for the stable value bond fund at the first stop point; and
using the optimized set of modified data states, continue to run the first path of the simulation from the first stop point until either additional stop points are reached or the first path simulation is completed.

15. The electronic computing device of claim 14, wherein after the first path of the simulation is completed, further comprising:
run one or more additional simulation paths; and
after the one or more additional simulation paths have been run, automatically determine an optimization for the stable value bond fund based on the simulation paths that were run.

16. The electronic computing device of claim 14, wherein the first path of the simulation includes one or more time steps, each time step including one or more simulation objects.

17. The electronic computing device of claim 16, wherein when the first path of the simulation advances from one time step to a next sequential time step, storing properties of each of the one or more simulation objects at the one time step before advancing to the next sequential time step.

18. The electronic computing device of claim 16, wherein at each time step, one or more of the simulation objects self-maps to a new value based on rules within the one or more of the simulation objects.

19. The electronic computing device of claim 14, wherein automatically determine an optimized set of modified data states for the stable value bond fund at the point in the first path of the simulation at which the first stop point is reached comprises:
automatically evaluate outcomes of the one or more recursive simulations and determine a set of data states for the recursive simulation that produced a best outcome of the one or more recursive simulations.

20. A non-transitory computer-readable data storage memory comprising instructions that, when executed by a processing unit of an electronic computing device, cause the processing unit to:
obtain an initial data state for an adaptive system;
use the initial data state to start a simulation for the adaptive system;
run a trial of the simulation of the adaptive system until a first stop point is reached;
when the first stop point is reached, run a plurality of recursive simulations from the first stop point, each recursive simulation representing an imaginary branch of the simulation of the adaptive system and including one or more possible future choices taken by the simulation of the adaptive system;
after the one or more recursive simulations have been run, automatically determine a first optimized set of modified data states for the adaptive system at the first stop point;
using the optimized set of modified data states, continue to run the trial of the simulation from the first stop point until a second stop point is reached;
upon reaching the second stop point, calculate a second optimized set of modified data states for the adaptive system at the second stop point; and
continue to run the trial until either additional stop points are reached or the trial of the simulation is completed.

* * * * *